(12) United States Patent
Goo et al.

(10) Patent No.: US 7,012,007 B1
(45) Date of Patent: Mar. 14, 2006

(54) STRAINED SILICON MOSFET HAVING IMPROVED THERMAL CONDUCTIVITY AND METHOD FOR ITS FABRICATION

(75) Inventors: Jung-Suk Goo, Stanford, CA (US); Qi Xiang, San Jose, CA (US); James Pan, Santa Clara, CA (US)

(73) Assignee: Advanced Micro Device, Inc., Sunnyvale, CA (US)

( * ) Notice: Subject to any disclaimer, the term of this patent is extended or adjusted under 35 U.S.C. 154(b) by 248 days.

(21) Appl. No.: 10/658,479

(22) Filed: Sep. 9, 2003

(51) Int. Cl.
*H01L 21/336* (2006.01)

(52) U.S. Cl. .................................. 438/296; 438/700

(58) Field of Classification Search .................. 257/77, 257/369, 351, 383, 292; 438/931, 692, 296, 438/700, 510, 301, 591, 702
See application file for complete search history.

(56) References Cited

U.S. PATENT DOCUMENTS

| | | | | |
|---|---|---|---|---|
| 4,994,413 A | * | 2/1991 | Eshita | 438/285 |
| 6,344,663 B1 | * | 2/2002 | Slater et al. | 257/77 |
| 6,555,476 B1 | * | 4/2003 | Olsen et al. | 438/692 |
| 6,576,929 B1 | * | 6/2003 | Kumar et al. | 257/77 |
| 6,744,084 B1 | * | 6/2004 | Fossum | 257/292 |

* cited by examiner

*Primary Examiner*—Howard Weiss
*Assistant Examiner*—(Vikki) Hoa B. Trinh
(74) *Attorney, Agent, or Firm*—Foley & Lardner LLP

(57) ABSTRACT

A strained silicon MOSFET employs a high thermal conductivity insulating material in the trench isolations to dissipate thermal energy generated in the MOSFET and to avoid self-heating caused by the poor thermal conductivity of an underlying silicon germanium layer. The high thermal conductivity material is preferably silicon carbide, and the isolations preferably extend through the silicon germanium layer to contact an underlying silicon layer so as to conduct thermal energy from the active region to the silicon layer.

9 Claims, 7 Drawing Sheets

STRAINED SILICON MOSFET HAVING IMPROVED THERMAL CONDUCTIVITY AND METHOD FOR ITS FABRICATION

BACKGROUND OF THE INVENTION

1. Field of the Invention

The present invention relates generally to fabrication of metal oxide semiconductor field effect transistors (MOSFETs), and, more particularly, to MOSFETs that achieve improved carrier mobility through the incorporation of strained silicon.

2. Related Technology

MOSFETs are a common component of integrated circuits (ICs). FIG. 1 shows a cross sectional view of a conventional MOSFET device. The MOSFET is fabricated on a silicon substrate 10 within an active region bounded by shallow trench isolations 12 that electrically isolate the active region of the MOSFET from other IC components fabricated on the substrate 10.

The MOSFET is comprised of a gate 14 that is separated from a channel region 16 in the substrate 10 by a thin first gate insulator 18 such as silicon oxide or silicon oxynitride. A gate voltage applied to the gate 14 controls the availability of carriers in the channel region 16. To minimize the resistance of the gate 14, the gate 14 is typically formed of a doped semiconductor material such as polysilicon.

The source and drain of the MOSFET comprise deep source and drain regions 20 formed on opposing sides of the channel region 16. The deep source and drain regions 20 are implanted by ion implantation subsequent to the formation of a spacer 22 around the gate 14, which serves as a mask during implantation to define the lateral positions of the deep source and drain regions 20 relative to the channel region 16.

Source and drain silicides 24 are formed on the deep source and drain regions 20 and are comprised of a compound comprising the substrate semiconductor material and a metal such as cobalt (Co) or nickel (Ni) to reduce contact resistance to the deep source and drain regions 20. The deep source and drain regions 20 are formed deeply enough to extend beyond the depth to which the source and drain silicides 24 are formed. The gate 14 likewise has a silicide 26 formed on its upper surface. A gate structure comprising a polysilicon material and an overlying silicide is sometimes referred to as a polycide gate.

The source and drain of the MOSFET further comprise shallow source and drain extensions 28. As dimensions of the MOSFET are reduced, short channel effects resulting from the small distance between the source and drain cause degradation of MOSFET performance. The use of shallow source and drain extensions 28 rather than deep source and drain regions near the ends of the channel 16 helps to reduce short channel effects. The shallow source and drain extensions 28 are implanted after the formation of a thin spacer 30 around the gate 14 and prior to the formation of the spacer 22, and the gate 14 and thin spacer 30 act as an implantation mask to define the lateral position of the shallow source and drain extensions 28 relative to the channel region 16. Diffusion during subsequent annealing causes the shallow source and drain extensions 28 to extend slightly beneath the gate 14.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. since the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET using a strained silicon layer is shown in FIG. 2. The MOSFET is fabricated on a substrate comprising a silicon germanium layer 32 grown on a silicon layer 10. An epitaxial layer of strained silicon 34 is grown on the silicon germanium layer 32. The MOSFET uses conventional MOSFET structures including deep source and drain regions 20, shallow source and drain extensions 28, a gate oxide layer 18, a gate 14 surrounded by spacers 30, 22, source and drain silicides 24, a gate silicide 26, and shallow trench isolations 12. The channel region of the MOSFET includes the strained silicon material, which provides enhanced carrier mobility between the source and drain.

One detrimental property of strained silicon MOSFETs of the type shown in FIG. 2 is that their thermal conductivity is significantly less than that of standard MOSFETs. Heat generated in the active regions of standard MOSFETs is conducted away from the active regions through the silicon substrate, which has relatively good thermal conductivity of 1.5 W/cm-C. Although the active regions are surrounded by shallow trench isolations that are filled with silicon oxide, which has a very poor thermal conductivity of 0.014 W/cm-C, the vertical path from the active regions to the bulk silicon material beneath substrate is sufficient to dissipate thermal energy generated in the active regions. In contrast, the silicon germanium layer used in strained silicon devices is a relatively poor conductor of heat, having a thermal conductivity that is approximately 0.1 W/cm-C for a silicon germanium layer having 20% germanium, or approximately one-fifteenth the thermal conductivity of silicon. As a result, the dissipation of thermal energy to the bulk silicon material is impeded by the silicon germanium layer, and significant self-heating problems can arise. Self-heating is known to degrade the I-V characteristics of the MOSFET, such that a reduced source-drain current Ids is produced for a given source-drain voltage Vds.

Therefore the advantages achieved by incorporating strained silicon into MOSFET designs are partly offset by the disadvantages resulting from the use of a silicon germanium substrate.

SUMMARY OF THE INVENTION

Embodiments of the present invention pertain to a strained silicon MOSFET device that exploits the benefits of strained silicon while reducing the detrimental effects of the use of a silicon germanium layer to impart strain to the strained silicon layer.

In accordance with embodiments of the invention, the shallow trench isolations that surround active regions are comprised of a high thermal conductivity insulating material. Silicon carbide (SiC) is a preferred insulating material because of its high thermal conductivity of 93.5 W/cm-C, and the shallow trench isolations preferably extend through the silicon germanium layer to contact the underlying silicon substrate. The high thermal conductivity insulating material helps to dissipate thermal energy generated in the active regions and effectively provides a network of thermally conductive channels that distribute thermal energy across the entire device and convey the thermal energy to the underlying silicon substrate.

In accordance with one embodiment of the invention, a MOSFET includes a substrate comprising a layer of silicon germanium grown on a layer of silicon and having a strained silicon channel region formed on the silicon germanium, with a gate overlying the strained silicon channel region and separated from the strained silicon channel region by a gate insulator, and with source and drain regions formed at opposing sides of the gate in the silicon germanium. Shallow trench isolations formed in the silicon germanium layer define an active region of the MOSFET. The shallow trench isolations comprise a high thermal conductivity insulating material for dissipating heat generated in the active region of the MOSFET. The insulating material preferably has a thermal conductivity that is greater than the thermal conductivity of silicon, and the insulating material is preferably silicon carbide. The shallow trench isolations preferably contact the silicon layer so that thermal energy from the active region is conducted to the silicon layer, and the insulating material may contact the silicon layer directly.

In accordance with another embodiment of the invention, a MOSFET is formed. Initially a substrate is provided. The substrate comprises a layer of silicon germanium grown on an underlying silicon layer. A layer of strained silicon may be grown on the layer of silicon germanium. Trenches are then formed in the silicon germanium to define an active region of the substrate. isolations are then formed in the trenches. The isolations comprise a high thermal conductivity insulating material. The insulating material is preferably silicon carbide, and the isolations preferably extend through the silicon germanium layer to contact the underlying silicon layer. A MOSFET is then formed on the substrate in the active region. The MOSFET comprises a layer of strained silicon formed on the silicon germanium in the active region.

DESCRIPTION OF THE DRAWINGS

Embodiments of the invention are described in conjunction with the following drawings, in which.

DETAILED DESCRIPTION OF PREFERRED EMBODIMENTS

Figure 1:
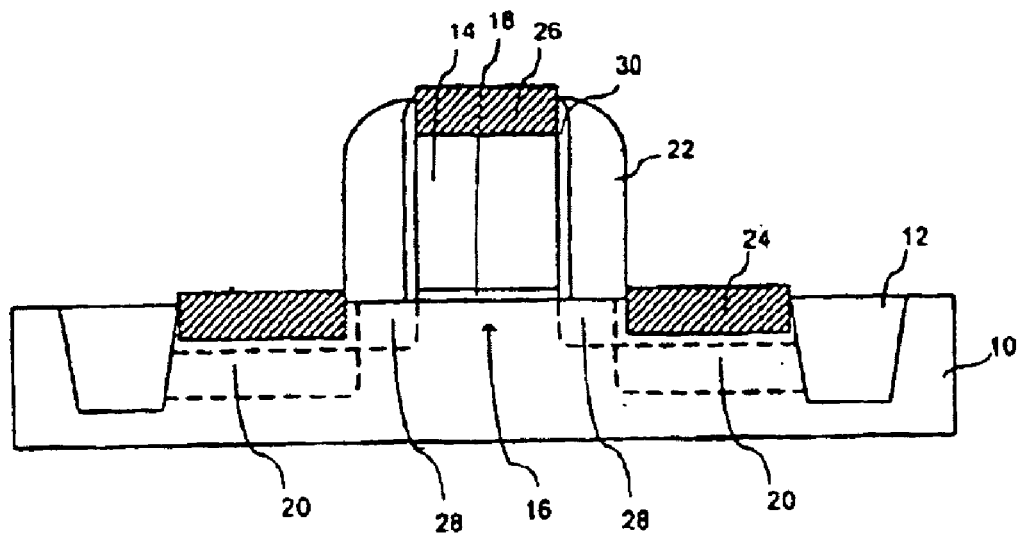
FIG. 1 shows a conventional MOSFET formed in accordance with conventional processing.
Figure 2:
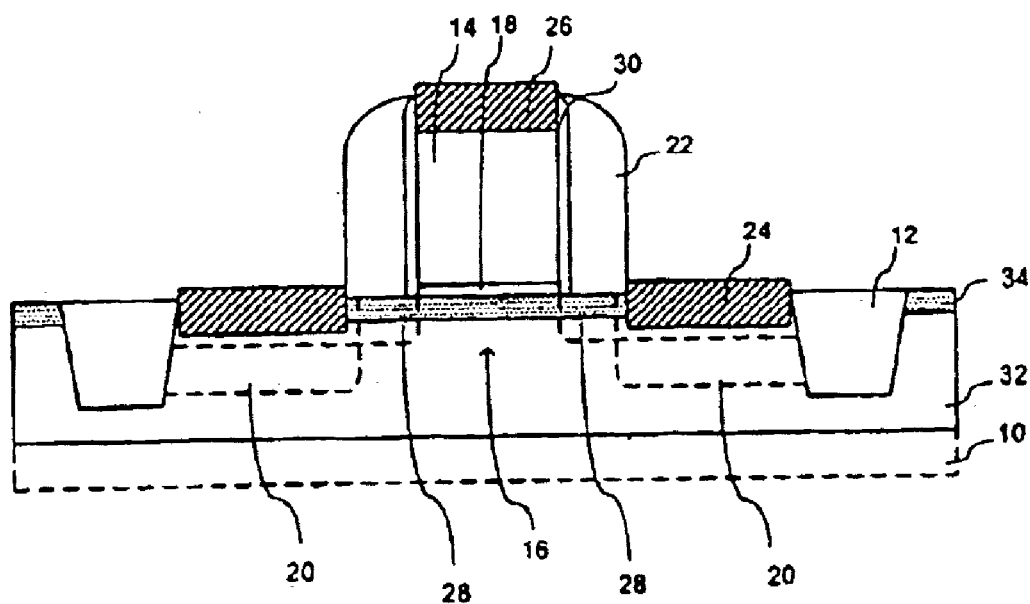
FIG. 2 shows a strained silicon MOSFET device formed in accordance with the conventional processing used to form the MOSFET of FIG. 1.
Figure 3A:
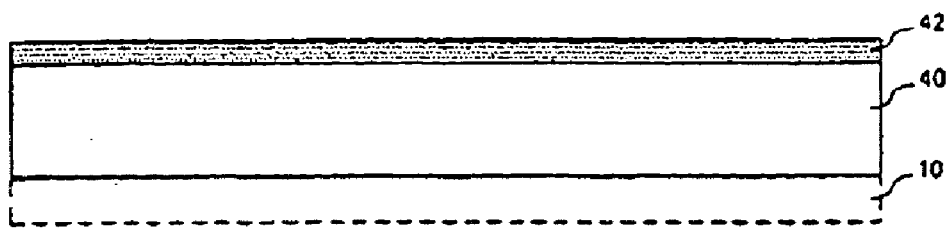
FIGS. 3a, 3b, 3c, 3d, 3e, 3f, 3g, 3h, 3i, 3j, 3k, 3L and 3m show structures formed during production of a MOSFET device in accordance with a first preferred embodiment of the invention.

FIGS. 3a–3m show structures formed during fabrication of a strained silicon MOSFET in accordance with a preferred embodiment of the invention. FIG. 3a shows a structure comprising a layer of silicon germanium 40 grown on a silicon substrate 10. The layer of silicon germanium 40 has an epitaxial layer of strained silicon 42 grown on its surface. The silicon germanium layer 40 preferably has a composition $Si_{1-x}Ge_x$, where x is approximately 0.2, and is more generally in the range of 0.1 to 0.3. Silicon germanium may be grown, for example, by chemical vapor deposition using $Si_2H_6$ (disilane) and $GeH_4$ (germane) as source gases, with a substrate temperature of 600 to 900 degrees C, a $Si_2H_6$ partial pressure of 30 mPa, and a $GeH_4$ partial pressure of 60 mPa. $SiH_4$ (silane) may be used as a source of silicon in alternative processes. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. The upper portion of the silicon germanium substrate 40 on which the strained silicon layer 42 is grown should have a uniform composition.

The strained silicon layer 42 is preferably grown by chemical vapor deposition (CVD) using $Si_2H_6$ as a source gas with a partial pressure of 30 mPa and a substrate temperature of approximately 600 to 900 degrees C. The strained silicon layer is preferably grown to a thickness of 200 Angstroms. The maximum thickness of strained silicon that can be grown without misfit dislocations will depend on the percentage of germanium in the silicon germanium layer 40.

Figure 3B:
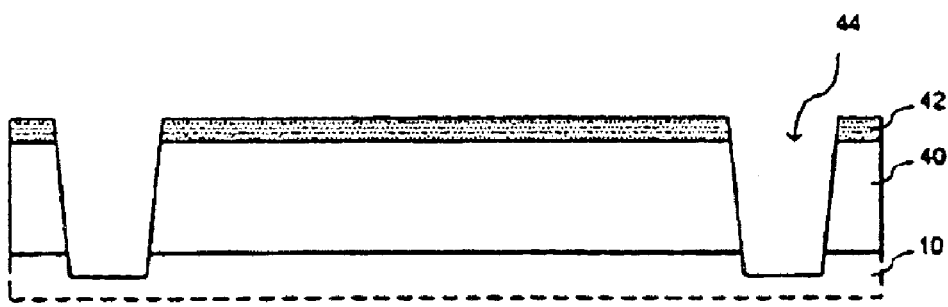

FIG. 3b shows the structure of FIG. 3a after formation of isolation trenches 44 having tapered sidewalls in the strained silicon layer 42 and the silicon germanium layer 40. The trenches are preferably deep enough that they expose the underlying silicon layer 10. The trenches define an active region of the substrate in which a MOSFET will be formed.

Figure 3C:
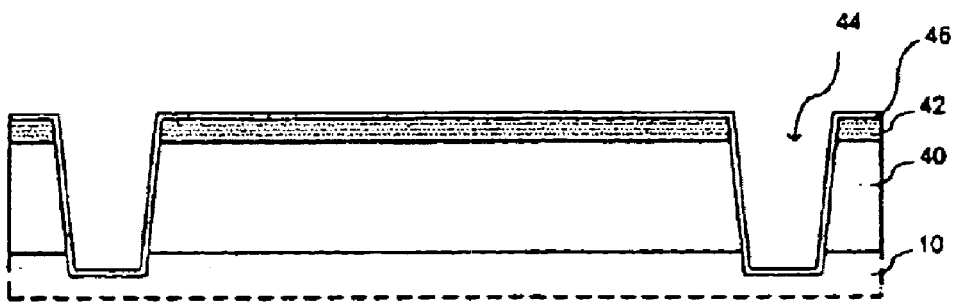

FIG. 3c shows the structure of FIG. 3b after formation of a thin oxide layer 46 on the surfaces of the trenches 44 and the strained silicon layer 42. The oxide layer 46 serves as an oxide liner for the trenches 44. The oxide layer 46 is preferably grown by a brief thermal oxidation.

Figure 3D:
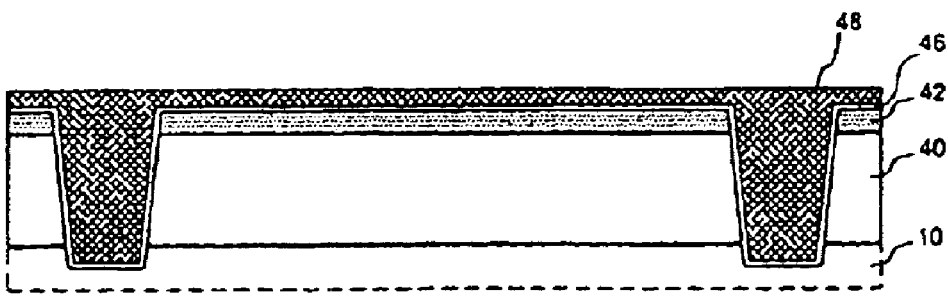

FIG. 3d shows the structure of FIG. 3c after deposition of a layer of high thermal conductivity insulating material 48 that fills the trenches. The high thermal conductivity insulating material is an electrically insulating material that has a thermal conductivity that is greater than the thermal conductivity of the silicon germanium layer, and that is preferably greater than the thermal conductivity of silicon. In the preferred embodiment the high thermal conductivity insulating material is silicon carbide, which has a thermal conductivity of 93.5 W/cm-C. The silicon carbide material may be formed by plasma vapor deposition (PVD) using a gas mixture comprising a silicon source, a carbon source, and an inert gas. The silicon source and the carbon source may be provided together by one or more organosilane compounds having the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$), among others may be used as the organosilane compound. Alternatively, silane ($SiH_4$) or disilane ($Si_2H_6$) may be used as the silicon source and methane ($CH_4$) may be used as the carbon source. Helium (He), argon (Ar), nitrogen ($N_2$), or combinations thereof, among others, may be used as the inert gas. In general, the silicon carbide material is deposited using a wafer temperature of about 150 degrees C to about 450 degrees C, a chamber pressure of about 1 torr to about 15 torr, a silicon source/carbon source flow rate of about 10 sccm to about 2000 sccm, an inert gas flow rate of less than about 1000 sccm, a plate spacing of about 300 mils to about 600 mils, and one or more RF powers of about 1 watt/$cm^2$ to about 500 watts/$cm^2$. The above process parameters provide a deposition rate for the silicon carbide layer in a range of about 100 angstroms/minute to about 3000 angstroms/minute.

Figure 3E:
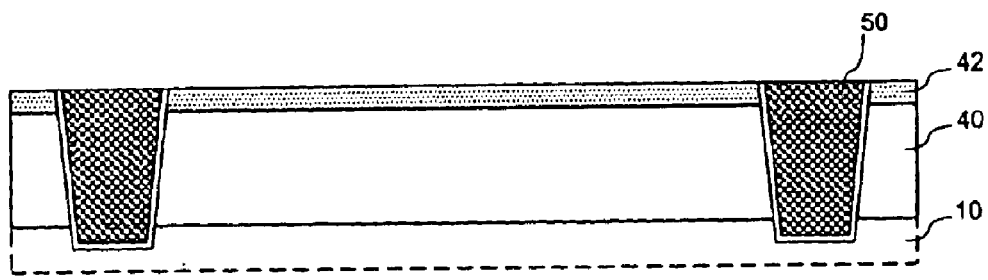

FIG. 3e shows the structure of FIG. 3d after planarization of the high thermal conductivity insulating material and the thermal oxide layer to form shallow trench isolations 50 that are approximately level with the surface of the strained silicon layer 42. Planarization may be achieved through chemical mechanical polishing (CMP) or an etch-back process. The high thermal conductivity insulating material may be densified before planarization. The shallow trench isolations comprise the thin oxide that lines the sidewalls of the trench, and the thermal conductivity insulating material that fills the trench.

Figure 3F:
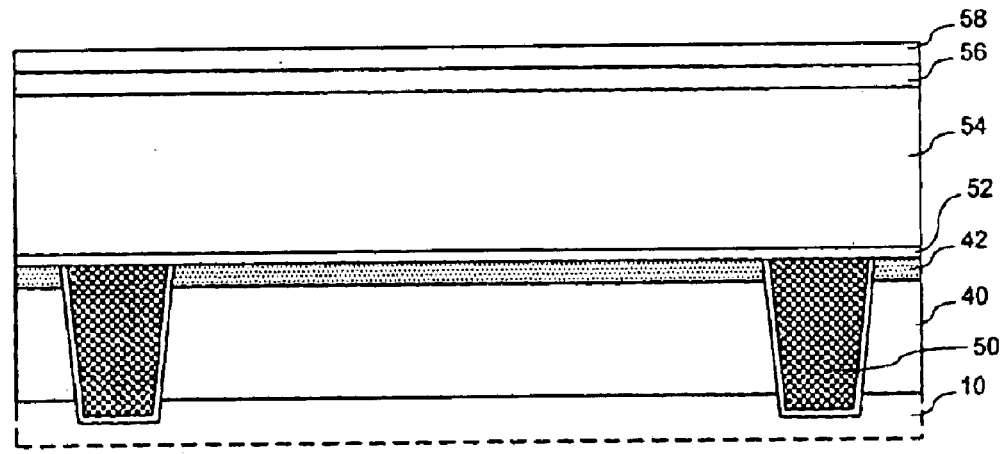

FIG. 3f shows the structure of FIG. 3e after formation of multiple layers of material over the strained silicon layer 42 and the shallow trench isolations 50. A gate insulating layer 52 is formed on the strained silicon layer 42. The gate insulating layer 52 is typically silicon oxide but may be another material such as silicon oxynitride. An oxide may be grown by thermal oxidation of the strained silicon layer 42, but is preferably deposited by chemical vapor deposition. Formed over the gate insulating layer 52 is a gate conductive layer 54. The gate conductive layer 54 typically comprises polysilicon but may alternatively comprise another material such as polysilicon implanted with germanium. Overlying the gate conductive layer 54 is a bi-layer hardmask structure comprising a lower hardmask layer 56, also referred to as a bottom antireflective coating (BARC), and an upper hardmask layer 58. The lower hardmask layer 56 is typically silicon oxide (e.g. $SiO_2$) and the upper hardmask layer 58 is typically silicon nitride (e.g. $Si_3N_4$).

Figure 3G:
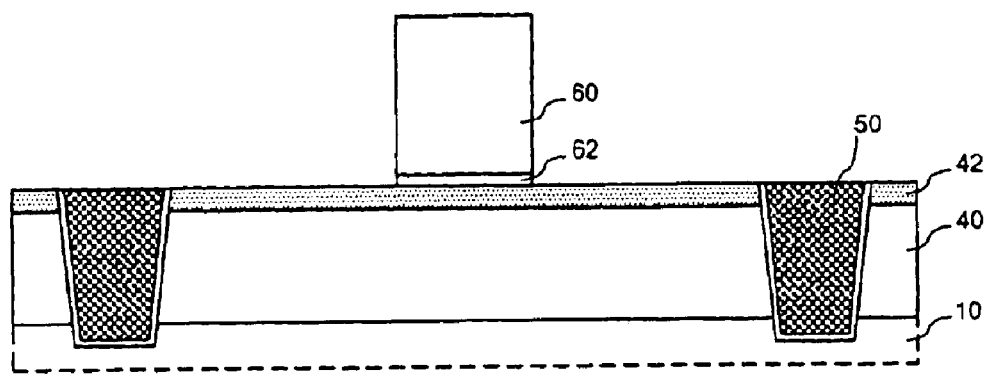

FIG. 3g shows the structure of FIG. 3f after patterning of the gate conductive layer and gate insulating layer to form a gate 60 and a gate insulator 62. Patterning is performed using a series of anisotropic etches that patterns the upper hardmask layer using a photoresist mask as an etch mask, then patterns the lower hardmask layer using the patterned upper hardmask layer as an etch mask, then patterns the polysilicon using the patterned lower hardmask layer as an etch mask, then patterns the gate insulating layer using the gate 60 as a hardmask.

Figure 3H:
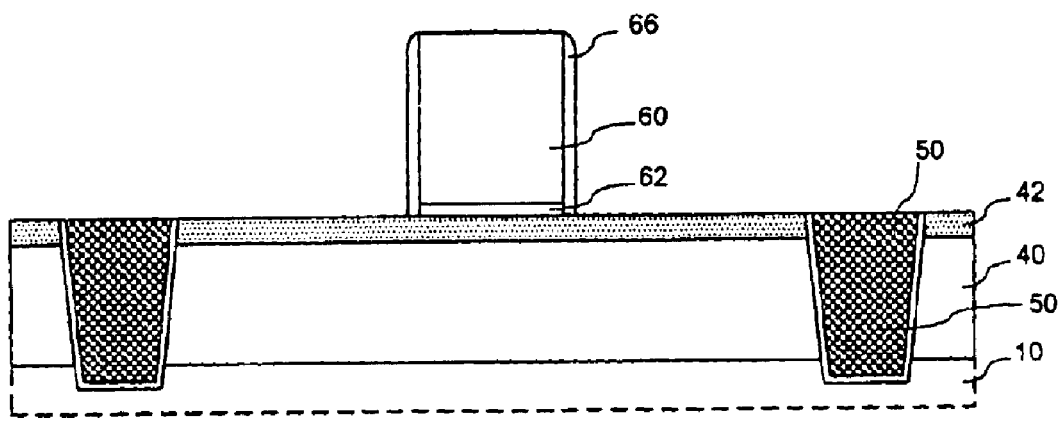

FIG. 3h shows the structure of FIG. 3g after formation of a thin first spacer 66 around the gate 60 and the gate insulator 62. The thin first spacer 66 is preferably formed by deposition of a conformal layer of a protective material, followed by anisotropic etching to remove the protective material from the non-vertical surfaces to leave the thin first spacer 66. The thin first spacer 66 is preferably formed of silicon oxide or silicon nitride.

Figure 3I:
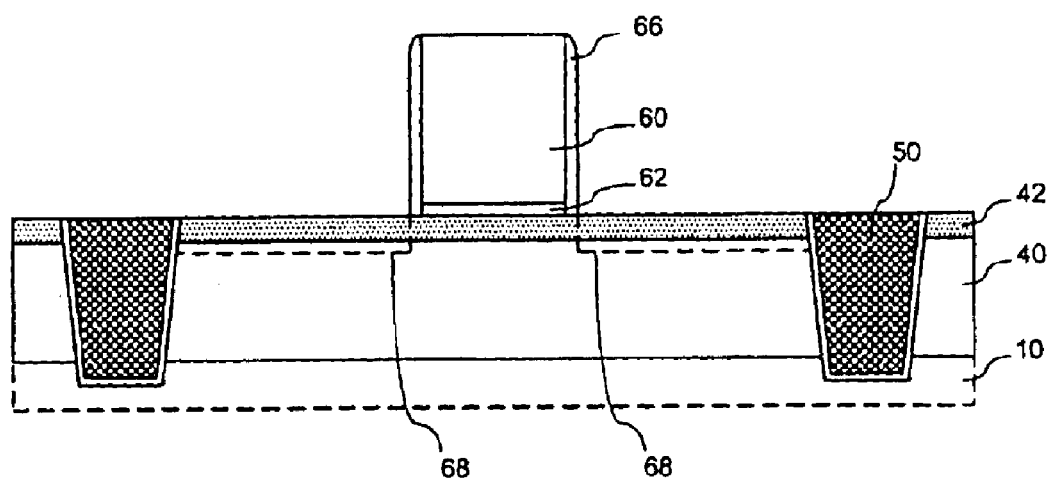

FIG. 3i shows the structure of FIG. 3h after implantation of dopant by ion implantation to form shallow source and drain extensions 68 in the strained silicon layer 42 and silicon germanium layer 40 at opposing sides of the gate 60. Halo regions (not shown) may be implanted prior to implantation of the shallow source and drain extensions 68. Halo regions are regions that are implanted with a dopant that is opposite in conductivity type to the conductivity type of the adjacent source or drain extension. The dopant of the halo regions retards diffusion of the dopant of the source or drain extension. Halo regions are preferably implanted using a low energy at an angle to the surface of the substrate so that the halo regions extend beneath the gate 60 to beyond the anticipated locations of the ends of the source and drain extensions 68 after annealing. The halo regions are formed at opposing sides of the channel region, and extend toward the channel region beyond the ends of the source and drain extensions to be formed.

Figure 3J:
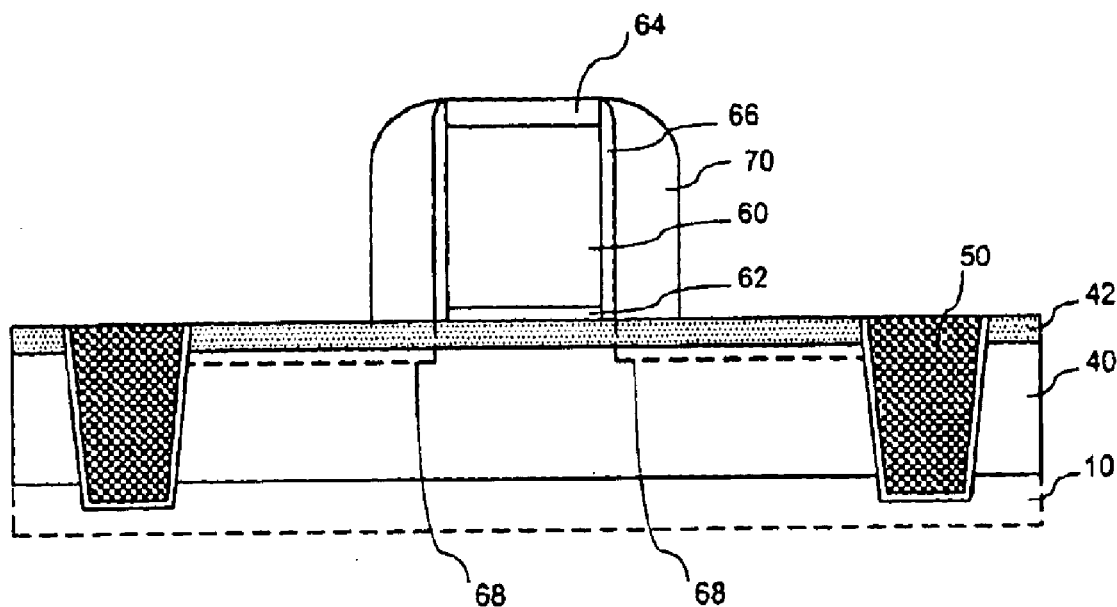

FIG. 3j shows the structure of FIG. 3i after formation of a second spacer 70 around the first spacer 66 and gate 60. The second spacer 70 is preferably formed of a material such as silicon oxide or silicon nitride.

Figure 3K:
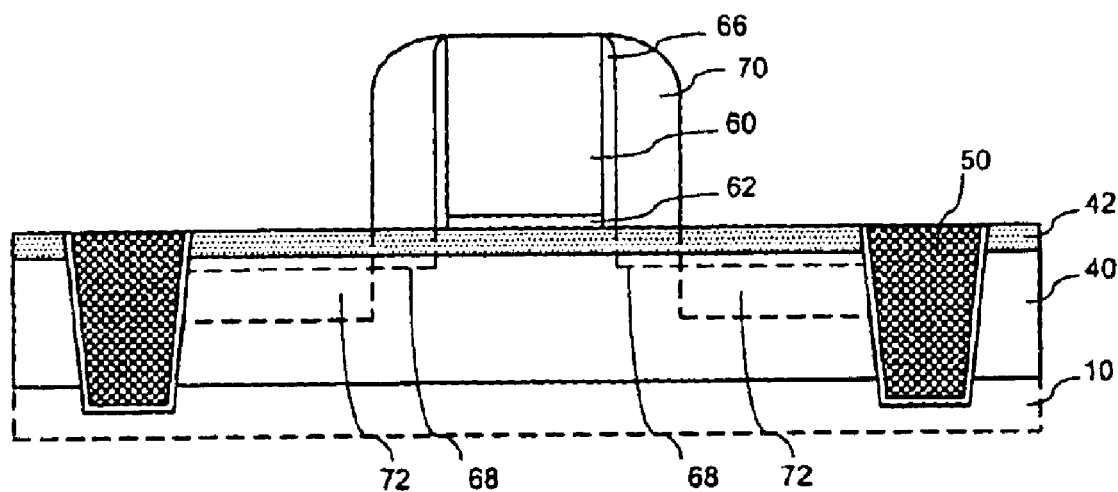

FIG. 3k shows the structure of FIG. 3j after formation of deep source and drain regions 72 in the strained silicon 42 and silicon germanium 40 layers at opposing sides of the gate by implantation of dopant. The second spacer 70 serves as a mask during implantation of the deep source and drain regions 72 to define the position of the source and drain regions 72 relative to the gate 60.

Figure 3L:
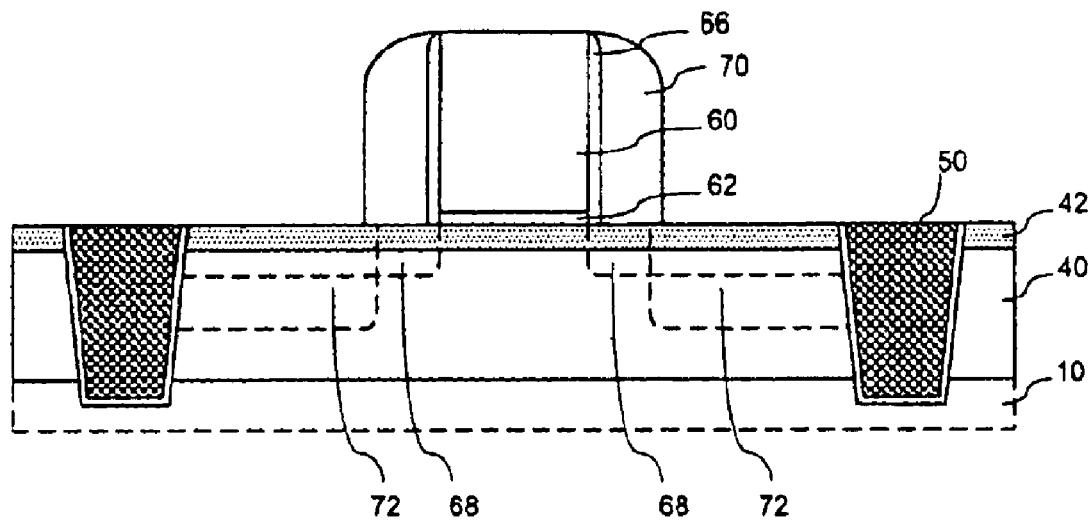

FIG. 3L shows the structure of FIG. 3k after performing rapid thermal annealing (RTA) to anneal the silicon germanium layer 40 and strained silicon layer 42 and to activate the dopants implanted in the shallow source and drain extensions 68 and the deep source and drain regions 72. During annealing the implanted dopant undergoes diffusion, causing a smoothing of the contours of the respective regions.

Figure 3M:
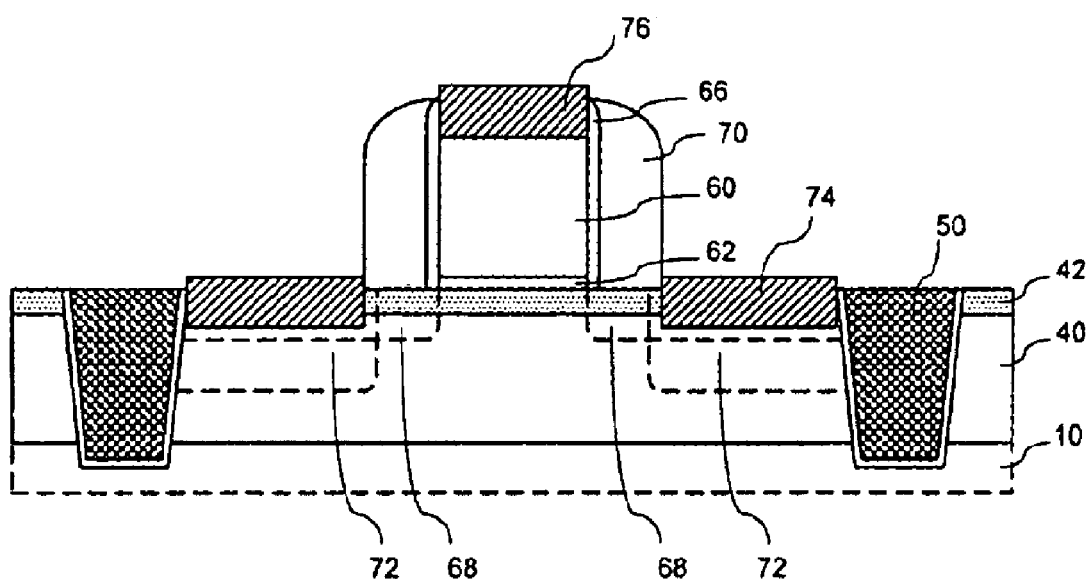

FIG. 3m shows the structure of FIG. 3L after removal of the protective gate cap 64 to expose the upper surface of the gate 60, followed by formation of silicide contacts 74 on the primary deep source and drain regions 72 and formation of a silicide contact 76 on the gate 60. The silicide contacts 74, 76 are formed of a compound comprising a semiconductor material and a metal. Nickel (Ni) is a preferred metal for the silicides. The silicide contacts are formed by depositing a thin conformal layer of the metal over the substrate, and then annealing to promote suicide formation at the points of contact between the metal and underlying semiconductor materials, followed by stripping of residual metal.

While the processing shown in FIGS. 3a–3m represents a presently preferred embodiment, a variety of alternatives may be implemented. For example, in accordance with one alternative, a different high thermal conductivity insulating material may be used. The alternative material preferably has a thermal conductivity that is greater than the thermal conductivity of the silicon germanium layer, and more preferably has a thermal conductivity that is greater than the thermal conductivity of silicon.

In accordance with another alternative embodiment, the oxide liner at the bottom of the shallow trench isolations may be removed before the trench is filled with silicon carbide or another insulating material so that the relatively poor thermal conductivity of the oxide does not impede the dissipation of thermal energy from the shallow trench isolations into the silicon substrate.

In accordance with another embodiment, it may be preferred to form the shallow trench isolations prior to growth of the strained silicon layer on the silicon germanium layer. This alternative may be preferred to reduce the risk of creating misfit dislocations in the strained silicon layer during the processing used to form the shallow trench isolations. In this alternative embodiment, the strained silicon is grown selectively on the silicon germanium after planarization of the shallow trench isolations.

In accordance with another embodiment, it may be preferred to perform additional processing to compensate for effects of differences in the etch rates of strained silicon and silicon germanium that are encountered when forming the shallow trench isolations. The differences in etch rates tend to produce an overhang portion of the strained silicon layer, resulting in the formation of silicon on insulator structures under the ends of the gate that are fully depleted and that therefore affect the threshold voltage Vt. The overhang may be avoided by selectively implanting silicon or another dopant into the strained silicon layer in the regions to be etched to form the shallow trench isolations, thereby increasing the silicon etch rate and reducing the overhang. Alternatively, the trench sidewalls may be implanted with dopant prior to filling the trenches to adjust the threshold voltage Vt beneath the overhang portions.

A variety of embodiments may therefore be implemented in accordance with the invention. In general terms, such embodiments encompass a MOSFET such as that shown in FIG. 3m, which includes a substrate comprising a layer of silicon germanium grown on a layer of silicon and having a strained silicon channel region formed on the silicon germanium, with a gate overlying the strained silicon channel region and separated from the strained silicon channel region by a gate insulator, and with source and drain regions formed at opposing sides of the gate in the silicon germanium. Shallow trench isolations formed in the silicon germanium layer define an active region of the MOSFET. The shallow trench isolations comprise a high thermal conductivity insulating material for dissipating heat generated in the active region of the MOSFET. The insulating material preferably has a thermal conductivity that is greater than the thermal conductivity of silicon, and that most preferably is silicon carbide. The shallow trench isolations preferably contact the silicon layer so that thermal energy from the active region is conducted to the silicon layer, and the insulating material may contact the silicon layer directly.

Figure 4:
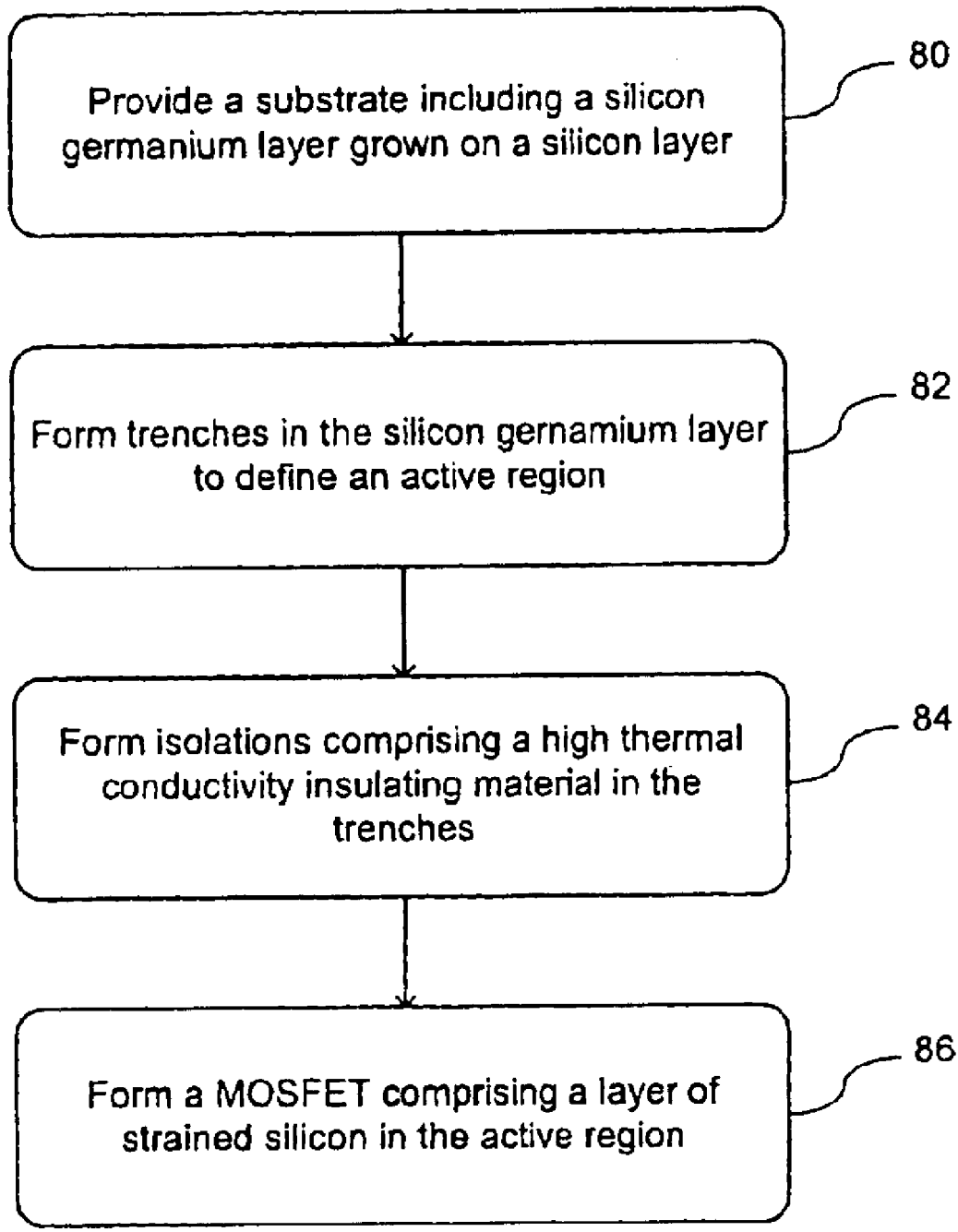
FIG. 4 shows a process flow encompassing the first preferred embodiment and alternative embodiments.

FIG. 4 shows a process flow encompassing the preferred embodiment of FIGS. 3a–3j, the aforementioned alternatives and other alternatives. Initially a substrate is provided (80). The substrate comprises a layer of silicon germanium grown on an underlying silicon layer. A layer of strained silicon may be grown on the layer of silicon germanium. Trenches are then formed in the silicon germanium layer to define an active region of the MOSFET (82). Isolations are then formed in the trenches (84). The isolations comprise a high thermal conductivity insulating material. The insulating material is preferably silicon carbide, and the isolations preferably extend through the silicon germanium layer to contact the underlying silicon layer. A MOSFET is then formed on the substrate in the active region (86). The MOSFET comprises a layer of strained silicon formed on the silicon germanium in the active region.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counterdoping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for forming a metal oxide semiconductor field effect transistor (MOSFET), comprising:

providing a substrate comprising a layer of silicon germanium grown on an underlying silicon layer;

forming trenches in the silicon germanium layer to define an active region of the MOSFET;

forming an oxide liner in the trenches;

forming a layer of silicon carbide over the substrate to fill the trenches;

planarizinq the silicon carbide to form isolations in the trenches; and forming a MOSFET on the substrate in the active region, the MOSFET comprising a layer of strained silicon formed on the silicon germanium in the active region.

2. The method claimed in claim 1, wherein the trenches formed in the silicon germanium layer exposes the underlying silicon layer and the isolations contact the silicon layer.

3. The method claimed in claim 1, wherein the oxide liner is formed on sidewalls of the trenches and wherein the silicon carbide of the isolations contacts the silicon layer.

4. The method claimed in claim 1, wherein a strained silicon layer is formed on the silicon germanium layer prior to forming the trenches, and wherein the trenches are formed in the strained silicon layer and the silicon germanium layer.

5. The method claimed in claim 1, wherein forming the MOSFET comprises:

forming a gate insulating layer on the strained silicon layer;

forming a gate conductive layer on the gate insulating layer; and patterning the gate conductive layer to form a gate overlying a gate insulator.

6. The method claimed in claim 5, wherein forming the MOSFET further comprises:

forming a first spacer around the gate; and implanting shallow source and drain extensions.

7. The method claimed in claim 6, wherein forming the MOSFET further comprises:

forming a second spacer around the first spacer; and implanting deep source and drain regions, wherein the second spacer serves as an implantation mask during implanting of the deep source and drain regions.

8. The method claimed in claim 7, wherein forming the MOSFET further comprises:

forming nickel silicide source and drain contacts and a nickel silicide gate contact.

9. The method claimed in claim 1, wherein the silicon germanium layer has a composition $Si_{1-x}Ge_x$, where x is in the range of 0.1 to 0.3.

* * * * *